(12) United States Patent
Yamagishi et al.

(10) Patent No.: US 12,387,948 B2
(45) Date of Patent: Aug. 12, 2025

(54) SYSTEM FOR PROCESSING SUBSTRATE AND MAINTENANCE METHOD THEREOF

(71) Applicant: TOKYO ELECTRON LIMITED, Tokyo (JP)

(72) Inventors: Takayuki Yamagishi, Tokyo (JP); Tomohiro Abe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 322 days.

(21) Appl. No.: 18/071,039

(22) Filed: Nov. 29, 2022

(65) Prior Publication Data

US 2023/0178395 A1 Jun. 8, 2023

(30) Foreign Application Priority Data

Dec. 6, 2021 (JP) ................. 2021-197993

(51) Int. Cl.
*H01L 21/67* (2006.01)
*H01L 21/677* (2006.01)

(52) U.S. Cl.
CPC .. *H01L 21/67196* (2013.01); *H01L 21/67201* (2013.01); *H01L 21/67742* (2013.01)

(58) Field of Classification Search
CPC ......... H01L 21/67196; H01L 21/67742; H01L 21/677; H01L 21/67201
See application file for complete search history.

(56) References Cited

U.S. PATENT DOCUMENTS

| 6,277,199 B1* | 8/2001 | Lei .................... H01L 21/67161 118/698 |
| 7,335,277 B2* | 2/2008 | Makino .............. H01L 21/6719 156/345.31 |
| 11,527,426 B2 | 12/2022 | Tsuji et al. |
| 2012/0014768 A1* | 1/2012 | Miyashita ......... H01L 21/67736 414/217 |
| 2015/0086302 A1* | 3/2015 | Senzaki ............. H01J 37/32899 414/800 |
| 2017/0110351 A1* | 4/2017 | Trussell .............. H01L 21/6732 |
| 2021/0111050 A1 | 4/2021 | Tsuji et al. |
| 2023/0054584 A1* | 2/2023 | Reuter .............. H01L 21/67155 |

FOREIGN PATENT DOCUMENTS

| JP | 2011-233788 A | 11/2011 |
| KR | 10-2007-0026220 A | 3/2007 |
| KR | 10-2019-0124803 A | 11/2019 |

* cited by examiner

*Primary Examiner* — Glenn F Myers
(74) *Attorney, Agent, or Firm* — Fenwick & West LLP (57) ABSTRACT

A system for processing a substrate using a plurality of vacuum processing chambers is provided. The system comprises: an atmospheric transfer chamber in an atmospheric atmosphere; a vacuum transfer chamber in a vacuum atmosphere; a plurality of processing modules configured by vertically arranging the vacuum processing chamber and a supplementary device; and a load lock chamber configured to switch an atmosphere therein between the atmospheric atmosphere and the vacuum atmosphere. The vacuum transfer chamber and the load lock chamber are arranged at a height position where a worker can enter thereunder, the load lock chamber and the plurality of vacuum processing chambers are connected to side surfaces of the vacuum transfer chamber, and a space below the vacuum transfer chamber is blocked from outside except for the side surface to which the load lock chamber is connected, and a space below the load lock chamber serves as a maintenance passage.

10 Claims, 7 Drawing Sheets

SYSTEM FOR PROCESSING SUBSTRATE AND MAINTENANCE METHOD THEREOF

CROSS-REFERENCE TO RELATED APPLICATIONS

This application claims priority to Japanese Patent Application No. 2021-197993 filed on Dec. 6, 2021, the entire contents of which are incorporated herein by reference.

TECHNICAL FIELD

The present disclosure relates to a system for processing a substrate and a maintenance method thereof.

BACKGROUND

Among apparatuses for processing a semiconductor wafer (hereinafter, referred to as "wafer") as a substrate in a manufacturing process of a semiconductor device, there is an apparatus that accommodates the wafer in a vacuum processing chamber, supplies a processing gas, and performs film formation, etching, and the like. Also, there is known a processing system in which a plurality of vacuum processing chambers are connected to a common vacuum transfer chamber for efficient processing.

In such a processing system with a plurality of vacuum processing chambers, the number of devices provided in the system also increases. Meanwhile, when the processing system is disposed in a factory with a limited floor space, reducing the footprint is a major issue. Thus, when attempting to reduce the occupied area by consolidating a large number of devices provided in the processing system in a limited space, securing a maintenance space for performing maintenance of each device becomes a problem.

Japanese Laid-open Patent Publication No. 2011-233788 discloses a substrate processing apparatus in which one side surface of a vacuum transfer chamber, which has a polygonal planar shape of pentagon or more, is set as a maintenance area, and a processing chamber for a glass substrate is connected to the other side surface.

SUMMARY

The present disclosure provides a technology that enables maintenance of the vacuum transfer chamber while suppressing an increase in the area occupied by the system.

In accordance with an aspect of the present disclosure, there is provided a system for processing a substrate using a plurality of vacuum processing chambers. The system comprises: an atmospheric transfer chamber in which the substrate is transferred in an atmospheric atmosphere; a vacuum transfer chamber in which the substrate is transferred in a vacuum atmosphere; a plurality of processing modules configured by vertically arranging the vacuum processing chamber and a supplementary device provided in the vacuum processing chamber supplementarily; and a load lock chamber provided between the atmospheric transfer chamber and the vacuum transfer chamber, and configured to be able to switch an atmosphere therein between the atmospheric atmosphere and the vacuum atmosphere while accommodating the substrate. The vacuum transfer chamber and the load lock chamber are arranged at a height position where a worker can enter thereunder, the load lock chamber and the plurality of vacuum processing chambers are connected to side surfaces of the vacuum transfer chamber, and a space below the vacuum transfer chamber is blocked from outside by the plurality of processing modules except for the side surface to which the load lock chamber is connected, and a space below the load lock chamber serves as a maintenance passage through which the worker enters from a direction other than the side surface to which the atmospheric transfer chamber is connected to reach the space below the vacuum transfer chamber.

DETAILED DESCRIPTION

<Overall Configuration>

Figure 1:
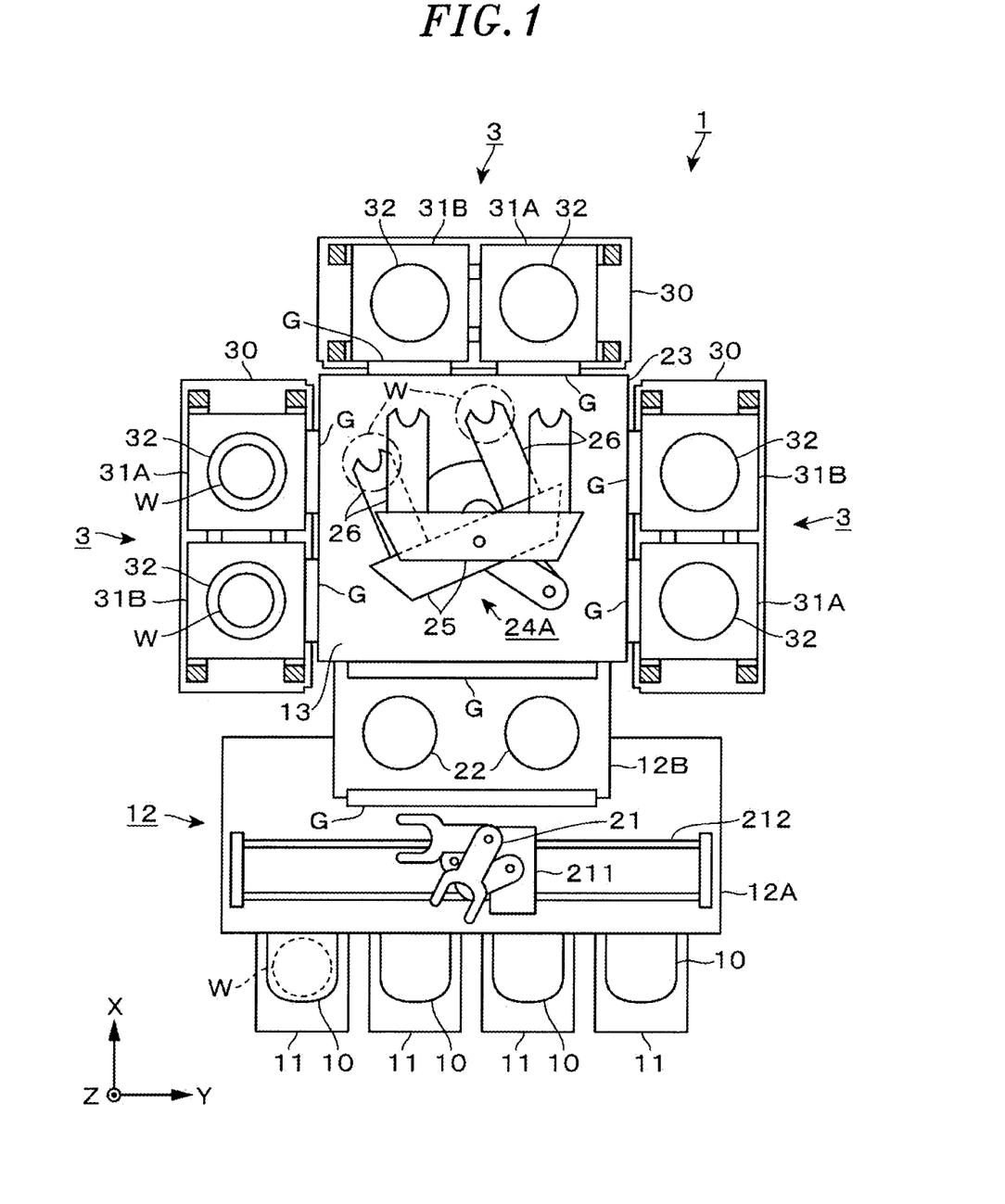
FIG. 1 is a plan view of a substrate processing system of the present disclosure.

An overall configuration of a substrate processing system 1 according to an embodiment of the present disclosure will be described with reference to a plan view of FIG. 1. FIG. 1 illustrates the substrate processing system 1 which performs a film forming process on a wafer W, which is a substrate, as vacuum processing. The substrate processing system 1 includes loading/unloading ports 11, a loading/unloading module 12, a vacuum transfer module 13, and processing modules 3.

Each of the processing modules 3 comprises two vacuum processing chambers 31A and 31B in which the wafers W are stored respectively. These vacuum processing chambers 31A and 31B are arranged side by side in a lateral direction with a gap between sidewalls. In the substrate processing system 1 of this example, it is configured such that the wafers W are collectively transferred into these vacuum processing chambers 31A and 31B by a substrate transfer robot with a multi-jointed arm 24A. In these vacuum processing chambers 31A and 31B, film forming process is collectively performed on each wafer W under the same processing conditions.

Hereinafter, each part constituting the substrate processing system 1 will be described. In FIG. 1, the X-axis direction is defined as a front-rear direction (the base end of the X-axis is defined as the front), and the Y-axis direction perpendicular to the X-axis is defined as a lateral direction (the same applies to FIGS. 2, 5, 6A, and 6B).

Four loading/unloading ports 11 are connected to the loading/unloading module 12, and a wafer transfer container 10 for containing the wafer W is placed on each loading/unloading port 11. The substrate processing system 1 is provided with the loading/unloading ports 11, the loading/unloading module 12, and the vacuum transfer module 13 in this order along the front-rear direction. Each of the processing modules 3 is connected to the left and right side surfaces and the rear side surface of the vacuum transfer module 13 as viewed from the front. That is, three processing modules 3 are connected so as to surround the vacuum transfer module 13 of this example from three side surfaces.

The loading/unloading module 12 includes an atmospheric transfer chamber 12A and a load lock chamber 12B. The atmospheric transfer chamber 12A is in an atmospheric atmosphere and has a multi jointed arm 21 for transferring the wafer W between the wafer transfer container 10 and the load lock chamber 12B. The multi jointed arm 21 is configured to be vertically movable, turnable, and extendable. Further, the multi jointed arm 21 is supported by a base portion 211, and the base portion 211 is configured to be movable in the left and right direction as viewed from the front side along a running track 212.

The load lock chamber 12B is provided between the atmospheric transfer chamber 12A and the vacuum transfer chamber 13. The load lock chamber 12B is configured such that the internal atmosphere can be switched between an atmospheric atmosphere and a vacuum atmosphere in a state in which the wafer W is accommodated therein. The load lock chamber 12B of this example includes two placing portions 22 arranged in the left and right direction as viewed from the front side. The multi jointed arm 21 of the atmospheric transfer chamber 12A is configured to transfer the wafer W between the two placing portions 22 and the wafer transfer container 10 and transfer the wafers W one by one to the two placing portions 22. The placing portion 22 includes a substrate support (not shown) that is composed of supporting pins supporting a plurality of positions off the center of the wafer W and spaced apart in the circumferential direction of the wafer W, for example.

The vacuum transfer module 13 includes a vacuum transfer chamber 23 in which a vacuum atmosphere is formed, and the vacuum transfer chamber 23 is provided with a multi-jointed arm 24A. The multi-jointed arm 24A is configured to be vertically movable, turnable, and extendable. An end effector 25 forming the tip of the multi-jointed arm 24A includes two holders 26 formed apart from each other. By holding the wafers W one by one in each holder 26, the multi jointed arm 24A can transfer two wafers W collectively with a predetermined interval. Two end effectors 25 are provided vertically apart, for example, and one end effector 25 can receive the wafer W from the chambers (the load lock chamber 12B and the vacuum processing chambers 31A and 31B) and the other end effector 25 can deliver the wafer W to the chambers.

As described above, the multi jointed arm 24A transfers two wafers W collectively. Accordingly, between the vacuum processing chambers 31A and 31B and the vacuum transfer module 13, two wafers W are transferred collectively. Further, two wafers W are transferred collectively between the load lock chamber 12B and the vacuum transfer module 13 as well.

The multi jointed arm 24A constitutes the substrate transfer robot of this example together with a driving part 24B described later.

Each of the vacuum processing chambers 31A and 31B is depressurized by a vacuum exhaust mechanism (not shown) to create a vacuum atmosphere. A stage 32 is provided inside each of the vacuum processing chambers 31A and 31B, and a film forming process is performed while the wafer W is placed on the stage 32. For example, when the film forming process is performed while heating the wafer W, the stage 32 is provided with a heater. Further, each of the vacuum processing chambers 31A and 31B is provided with a gas supply composed of a shower head or the like and supplying a film forming gas to the wafer W placed on the stage 32. These heater and gas supply are omitted from the drawings. Further, the stage 32 is provided with supporting pins (not shown) for transferring the wafer to be loaded/unloaded.

Here, the vacuum processing chambers 31A and 31B are not limited to being configured to perform the film forming process, but may be configured to perform other processes such as etching, cleaning, ashing, and the like.

Agate valve G is provided respectively between the atmospheric transfer chamber 12A and the load lock chamber 12B, between the load lock chamber 12B and the vacuum transfer module 13, and between each of the vacuum processing chambers 31A and 31B provided in the processing module 3 and the vacuum transfer module 13. The gate valve G opens and closes a transfer port for the wafer W, and make it possible to independently adjust the atmosphere in the atmospheric transfer chamber 12A and in each of the chambers 12B, 23, 31A, and 31B.

In the substrate processing system 1 described above, the wafer W is transferred from the wafer transfer container 10 to the vacuum processing chambers 31A and 31B connected to the vacuum transfer module 13 and processed, and then returned to the wafer transfer container 10.

<Layout of Vacuum Transfer Module 13>

A more detailed layout of the substrate processing system 1 having the above configuration will be described with reference to an external perspective view of FIG. 2 or the like.

As shown in FIG. 1, the vacuum transfer module 13 of this example has a configuration in which one load lock chamber 12B and three processing modules 3 are connected to four side surfaces of the vacuum transfer chamber 23 that is square in plan view.

Figure 6A:
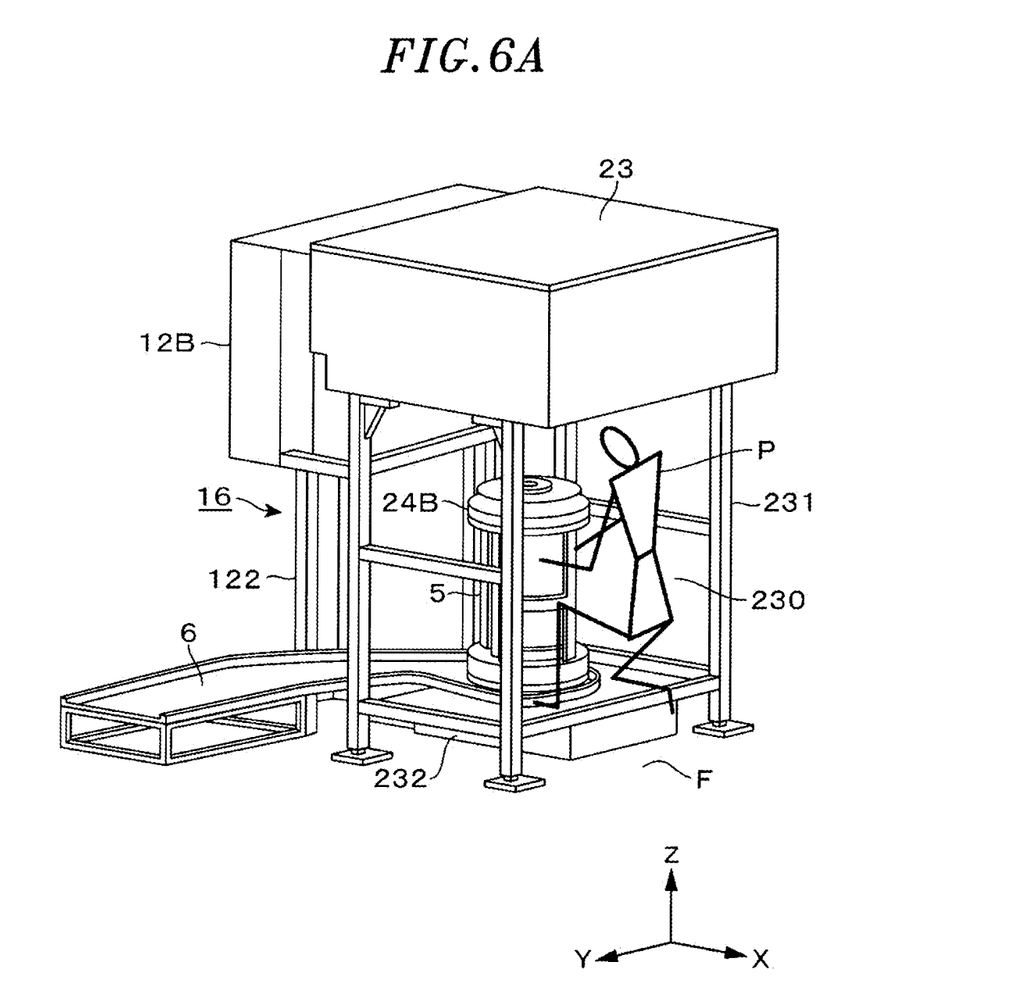
FIG. 6A is a first explanatory diagram relating to an example of an unloading operation of the driving mechanism through a maintenance passage.

As shown in a schematic configuration of FIG. 6A, the vacuum transfer chamber 23 is configured as a housing that is flat in a vertical direction, and the load lock chamber 12B and the processing modules 3 described above are connected to the sidewalls thereof. As described with reference to FIG. 1, the multi jointed arm 24A is provided inside the vacuum transfer chamber 23, while the driving part 24B for driving the multi jointed arm 24A is provided outside the vacuum transfer chamber 23.

As shown in FIG. 6A, the vacuum transfer chamber 23 is supported from below by a framework 231 which is a skeleton framing, and is positioned on a floor surface F of a semiconductor factory building where the substrate processing system 1 is installed. A space having a height dimension of, for example, about 1000 to 1600 mm is formed between the lower surface of the vacuum transfer chamber 23 supported by the framework 231 and the floor surface F of the factory.

Within this space, a cable box 232 containing power supply cables for supplying power to power consumption equipment, instrumentation cables, and the like is disposed in a space within a range of about 150 to 300 mm from the floor surface.

Further, a space between the upper surface of the cable box 232 and the lower surface of the vacuum transfer chamber 23 serves as a maintenance space 230 where a worker P can enter to perform maintenance work.

Here, in the vacuum transfer chamber 23 of this example, the wafer W is transferred by the multi jointed arm 24A at a transfer height of 1500 mm or higher from the floor surface F. The transfer height in the conventional vacuum transfer chamber 23 was set within a range of about 1100 to 1350 mm. In the vacuum transfer chamber 23 of this example, the transfer height of the wafer W is set at a higher position than in the conventional art, thereby securing the maintenance space 230 in which the worker P can easily perform a work.

Figure 3:
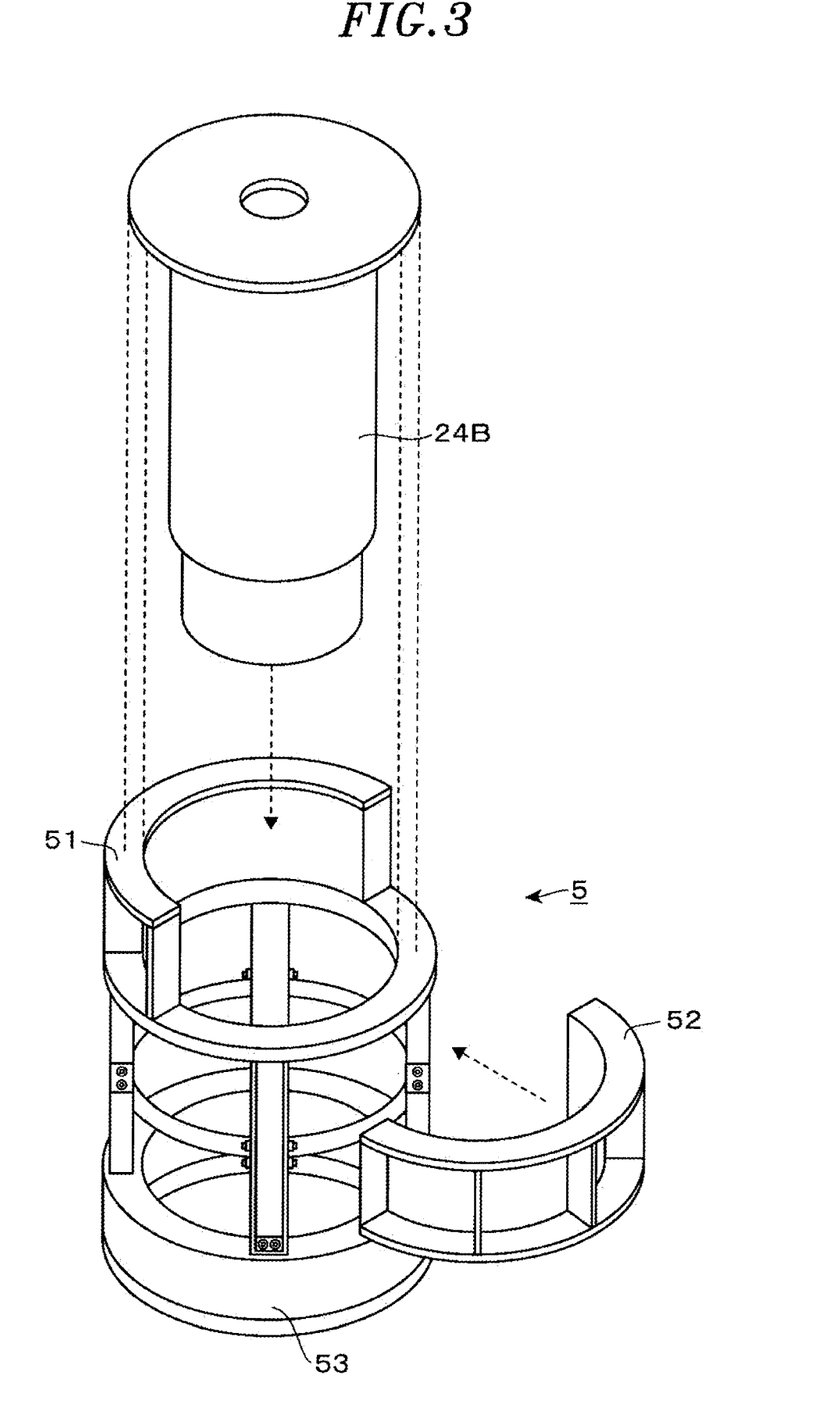
FIG. 3 is a perspective view showing a configuration example of a multi jointed arm driving mechanism and a transfer container thereof.

Further, the driving part 24B for driving the multi jointed arm 24A is disposed in this maintenance space 230. As shown in FIG. 3, the driving part 24B is configured as a vertically elongated columnar body, for example, a cylindrical body, and has a height dimension within a range of about 550 to 850 mm and a maximum diameter within a range of about 350 to 550 mm.

A driving mechanism for performing the lifting, turning, and expansion/contracting operations of the multi jointed arm 24A is accommodated inside the driving part 24B. The driving part 24B is attached to the central portion of the lower surface of the vacuum transfer chamber 23 with the long axis of the cylindrical body directed vertically. The driving part 24B is suspended from the lower surface of the vacuum transfer chamber 23 so as to protrude downward toward the maintenance space 230 (a state in which the driving part 24B is attached to the vacuum transfer chamber 23 is not shown). The driving part 24B constitutes the substrate transfer robot of this example together with the multi jointed arm 24A.

<Layout of Processing Modules 3>

Next, a layout configuration of the processing modules 3 connected to the side surfaces of the vacuum transfer chamber 23 will be described. As described with reference to FIG. 1, in the substrate processing system 1 of this example, two vacuum processing chambers 31A and 31B are connected to each of three side surfaces of the vacuum transfer chamber 23. In each of the vacuum processing chamber 31A and 31B, a large number of devices such as equipment related to the gas supply for supplying a film forming gas, equipment related to an exhaust system for evacuating the vacuum processing chambers 31A and 31B, a power supply system for supplying power to a heater or the like, a control device related to various types of control, and the like are provided supplementarily. In the following description, these devices are also referred to as "supplementary devices."

On the other hand, as described in Background, in the substrate processing system 1, it is required to suppress an increase in the exclusive area of the substrate processing system 1 installed on the floor surface F of the factory. Particularly, when two vacuum processing chambers 31A and 31B are disposed side by side, since supplementary devices are provided corresponding to each of the vacuum processing chambers 31A and 31B, it is necessary to efficiently arrange a large number of these devices.

Therefore, in the substrate processing system 1 of this example, by configuring the processing module 3 by arranging the vacuum processing chambers 31A and 31B and their supplementary devices in the vertical direction, an increase in the exclusive area of each processing module 3 is suppressed. For example, the processing module 3 has a structure in which the above-described vacuum processing chambers 31A and 31B and their supplementary devices are installed in a rack that is the skeleton framing and arranged in the vertical direction. The processing module 3 may have a configuration in which a casing 30 covers the outer surface of the rack accommodating a large number of devices.

Figure 2:
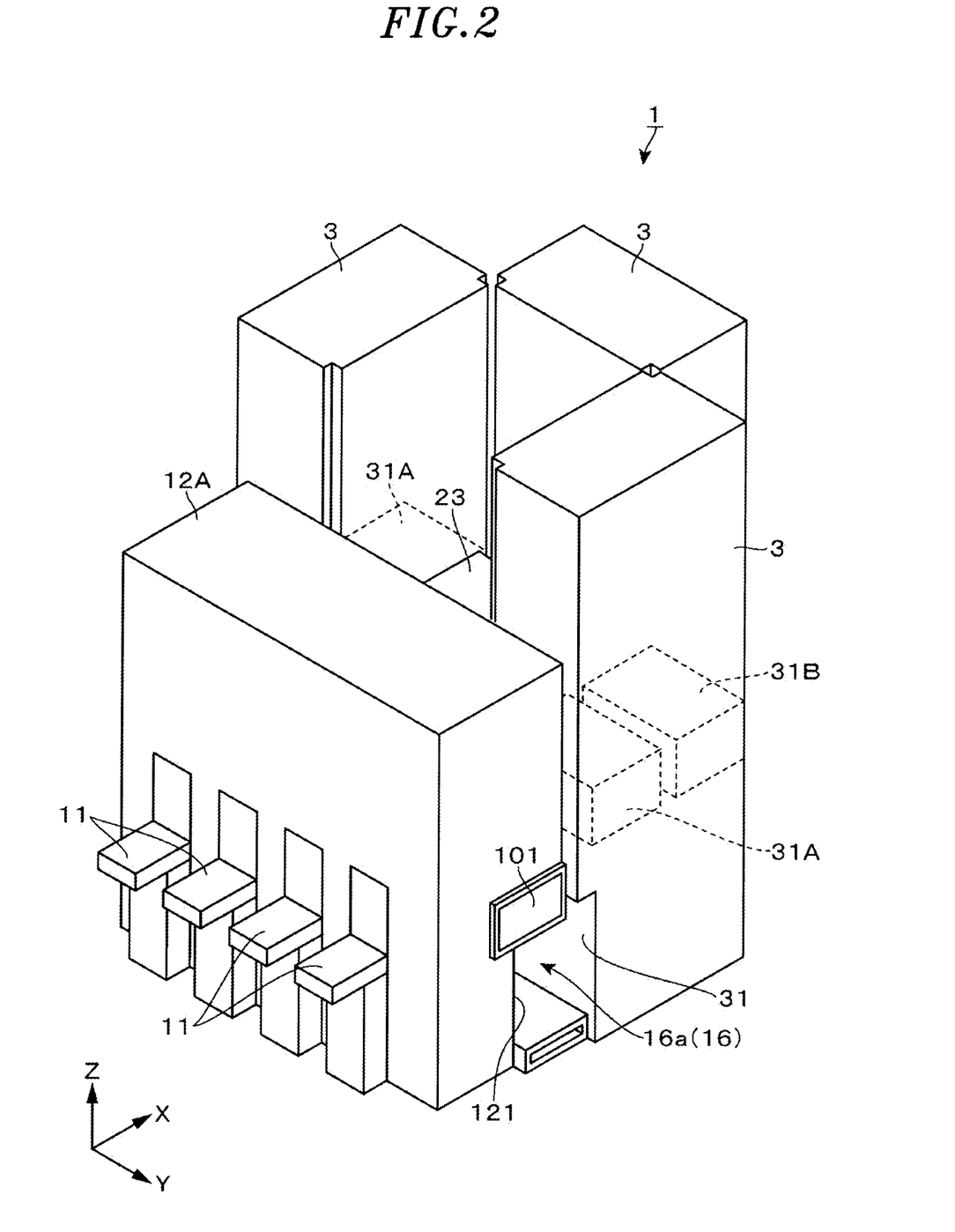
FIG. 2 is an external perspective view of the substrate processing system of the present disclosure.

As indicated by broken lines in FIG. 2, the vacuum processing chambers 31A and 31B in the processing module 3 are arranged at a height position connectable to the vacuum transfer chamber 23.

The processing modules 3 connected to the three side surfaces of the vacuum transfer chamber 23 have a common configuration. By employing the processing modules 3 having a common configuration, the design cost can be reduced compared to the case where the processing modules 3 having different configurations are provided according to the arrangement position. Further, it is possible to suppress irregularities in the processing conditions of the wafers W caused by differences in the arrangement positions of the vacuum processing chambers 31A and 31B and the supplementary devices and accompanying differences in pipe lengths and the like and to perform a uniform film forming process between different processing modules 3.

As illustrated in FIG. 1, when viewed from the side of the vacuum transfer chamber 23, the width of the processing modules 3 is configured to match the width of the sidewall of the vacuum transfer chamber 23. Further, the depth of the processing modules 3 viewed from the same direction is configured to match the depth of the vacuum processing chambers 31A and 31B. In this way, in each processing module 3, a large number of devices are collectively arranged in a relatively narrow area.

As a result of collectively arranging a large number of devices in each processing module 3 in this manner, as illustrated in FIG. 2, the upper end of the processing module 3 extends to a position higher than the upper surface of the vacuum transfer chamber 23 supported by the framework 231. As for the height dimension of the processing module 3, a range of about 2500 to 3500 mm can be exemplified.

Further, as shown in FIG. 2, the processing module 3 is configured to extend from the floor surface F side of the factory where the substrate processing system 1 is disposed to a height position above the upper surface of the vacuum transfer chamber 23. Since the processing modules 3 having such a configuration are provided along three side surfaces of the vacuum transfer chamber 23, the maintenance space 230 below the vacuum transfer chamber 23 described with reference to FIG. 6A is closed from the three sides by these processing modules 3.

<Layout of Atmospheric Transfer Chamber 12A and Load Lock Chamber 12B>

Next, the layout configuration of the atmospheric transfer chamber 12A and the load lock chamber 12B will be described.

As shown in the schematic appearance configuration in FIG. 6A, the load lock chamber 12B is configured as a housing that is flat in the front-rear direction. The placing portions 22 in the load lock chamber 12B are provided such that the transfer height of the wafer W between the supporting pins (not shown) and the multi jointed arm 24A on the side of the vacuum transfer chamber 23 matches the above-described transfer height (1500 mm or higher from the floor surface F) of the wafer W.

Further, the gate valve G is provided on each of the front and rear side surfaces of the load lock chamber 12B.

As shown in FIG. 6A, the load lock chamber 12B is supported from below by a framework 122 which is a skeleton framing, and is disposed above the floor surface F. A space having a height dimension of about 800 to 1400 mm is formed between the lower surface of the load lock chamber 12B supported by the framework 122 and the floor surface F.

Within this space, the above-described cable box 232 and the like are disposed in a space within a range of about 150 to 300 mm from the floor surface. Further, a space between the upper surface of the cable box 232 and the lower surface of the load lock chamber 12B is connected to the above-described maintenance space 230 on the side of the vacuum transfer chamber 23, and serves as a maintenance passage 16 through which the worker P entering the maintenance space 230 passes.

As shown in FIG. 2, the atmospheric transfer chamber 12A includes a housing in which the multi jointed arm 21 is disposed and which constitutes a space in which the wafer W is transferred by the multi jointed arm 21, and has a configuration in which the loading/unloading ports 11 are connected to the front surface of the housing. The atmospheric transfer chamber 12A has a height dimension from the floor surface F side to a height position above the upper surface of the vacuum transfer chamber 23. Further, the width dimension of the atmospheric transfer chamber 12A seen from the front side is configured to be wider than the width dimension of the load lock chamber 12B and the vacuum transfer chamber 23.

As shown in the plan view of FIG. 1, a recess is formed on the rear surface of the atmospheric transfer chamber 12A, and the front half of the load lock chamber 12B is fitted into the recess. With this configuration, a touch panel display 101, a control computer (not shown), and the like, which constitute the substrate processing system 1, are disposed on both sides of the load lock chamber 12B, thereby preventing the exclusive area of the substrate processing system 1 from increasing more than necessary.

<Maintenance Passage>

In the substrate processing system 1 having the layout configuration described above, the maintenance space 230 formed below the vacuum transfer chamber 23 is blocked from the outside by the processing modules 3 except for the surface to which the load lock chamber 12B is connected. Here, the expression "blocked" is not limited to, for example, the case where adjacent processing modules 3 are densely arranged without gaps. Even when a gap is formed between these processing modules 3, if the worker P cannot enter through the gap, it can be said that, for the worker P, these surfaces are blocked from the outside by the processing modules 3.

Further, since the atmospheric transfer chamber 12A is disposed on the front surface of the load lock chamber 12B, the maintenance space 230 cannot be entered from the front either. Therefore, the substrate processing system 1 of this example is configured such that the worker P enters the maintenance space 230 through the maintenance passage 16 from the side surfaces, which are directions other than the surface (front surface of the load lock chamber 12B) to which the atmospheric transfer chamber 12A is connected when viewed from the front side.

On the other hand, as described above, the substrate processing system 1 of this example is configured such that the front half of the load lock chamber 12B is fitted into the recess formed on the rear surface of the atmospheric transfer chamber 12A. Therefore, it may be difficult for the worker P to enter the maintenance passage 16 through the gap between the load lock chamber 12B and the processing modules 3 in this state.

Therefore, as shown in FIG. 2, a notch 121 is formed on, for example, a lower position of the rear surface on the right side when the atmospheric transfer chamber 12A is viewed from the front. A notch 31 is also formed on the processing module 3 side in a region facing the notch 121 of the atmospheric transfer chamber 12A. A tunnel-shaped space formed by these notches 121 and 31 constitutes part of the maintenance passage 16 together with the space below the load lock chamber 12B. The maintenance passage 16 formed by the notches 121 and 31 opens toward the side surface of the atmospheric transfer chamber 12A to form an opening 16a, so that the worker P can enter the maintenance passage 16. An example of the opening dimension of the opening 16a will be described in accordance with a structure of a transfer container 5 of the driving part 24B, which will be described later.

If there is a sufficient gap between the atmospheric transfer chamber 12A and the processing module 3 and the worker P can enter, providing the notches 121 and 31 is not an essential requirement.

On the other hand, as described above, the areas on both sides of the load lock chamber 12B are also used as areas where the components of the substrate processing system 1 are arranged. In this respect, if the notch 121 is formed in the atmospheric transfer chamber 12A, the space for arranging the devices is reduced accordingly. From this point of view, in the substrate processing system 1 of this example, the opening 16a is not provided (the notch 121 is not formed) on the left side of the atmospheric transfer chamber 12A when viewed from the front.

Further, as described above, in the substrate processing system 1 of this example, the processing modules 3 have a common configuration. Therefore, although it is hidden from view in FIG. 2, the notches 31 are also formed at common positions on the other processing modules 3 arranged on the rear side and the left side of the vacuum transfer chamber 23. These notches 31 do not have dimensions that allow the worker P to enter the maintenance space 230. On the other hand, these notches 31 can be used as windows for lighting when the worker P performs work in the maintenance space 230, transfer passages for transferring small parts, spaces for arranging power supply cables of jigs used when performing maintenance work, and the like.

<Jig for Transferring Driving Part 24B>

Next, an example of a configuration of jigs (the transfer container 5 and a slide plate 6) for loading and unloading the driving part 24B, which is one of the largest devices provided in the vacuum transfer chamber 23, through the maintenance passage 16 described above. In the substrate processing system 1 of this example, the driving part 24B is accommodated in the transfer container 5, and is slid on the detachable slide plate 6 laid along a transfer passage thereof for transfer.

<Transfer Container 5>

FIG. 3 shows an external perspective view of the driving part 24B and the transfer container 5 thereof. As described above, the driving part 24B, which is configured as a cylindrical body with a height of about 550 to 850 mm, is vertically placed with its long axis directed in the vertical direction, and is suspended from the lower surface of the vacuum transfer chamber 23 so as to protrude downward. Further, the driving part 24B has a weight of about 60 to 100 kg. For this reason, it is difficult to overturn the driving part 24B without using a device such as a trolley crane or a hoist. However, there is little room for locating these devices within the tight maintenance space 230.

Therefore, in the substrate processing system 1 of this example, the transfer container 5 is configured as a basket-like container that can accommodate the driving part 24B with vertically placed. If the lower end of the driving part 24B suspended from the lower surface of the vacuum transfer chamber 23 and the upper end of the transfer container 5 interfere with each other, a part of the upper portion of the transfer container 5 may be a detachable portion 52 that can be detached from a main body 51.

A resin plate 53 is provided on the bottom surface of the transfer container 5 to reduce friction acting between the transfer container 5 and the slide plate 6, thereby facilitating sliding movement. Further, by not providing casters for movement, the height dimension of the transfer container 5 is reduced.

The transfer container 5 in which the driving part 24B is accommodated has an overall height dimension within a range of about 600 to 950 mm and an overall width dimension within a range of about 400 to 600 mm. Therefore, the height and width of the maintenance passage 16 and the opening 16*a* formed by the notches 121 and 31 of the atmospheric transfer chamber 12A and the processing modules 3 are configured to have a dimension so that the transfer container 5 in which the driving part 24B is accommodated can pass therethrough.

<Slide Plate 6>

Figure 5:
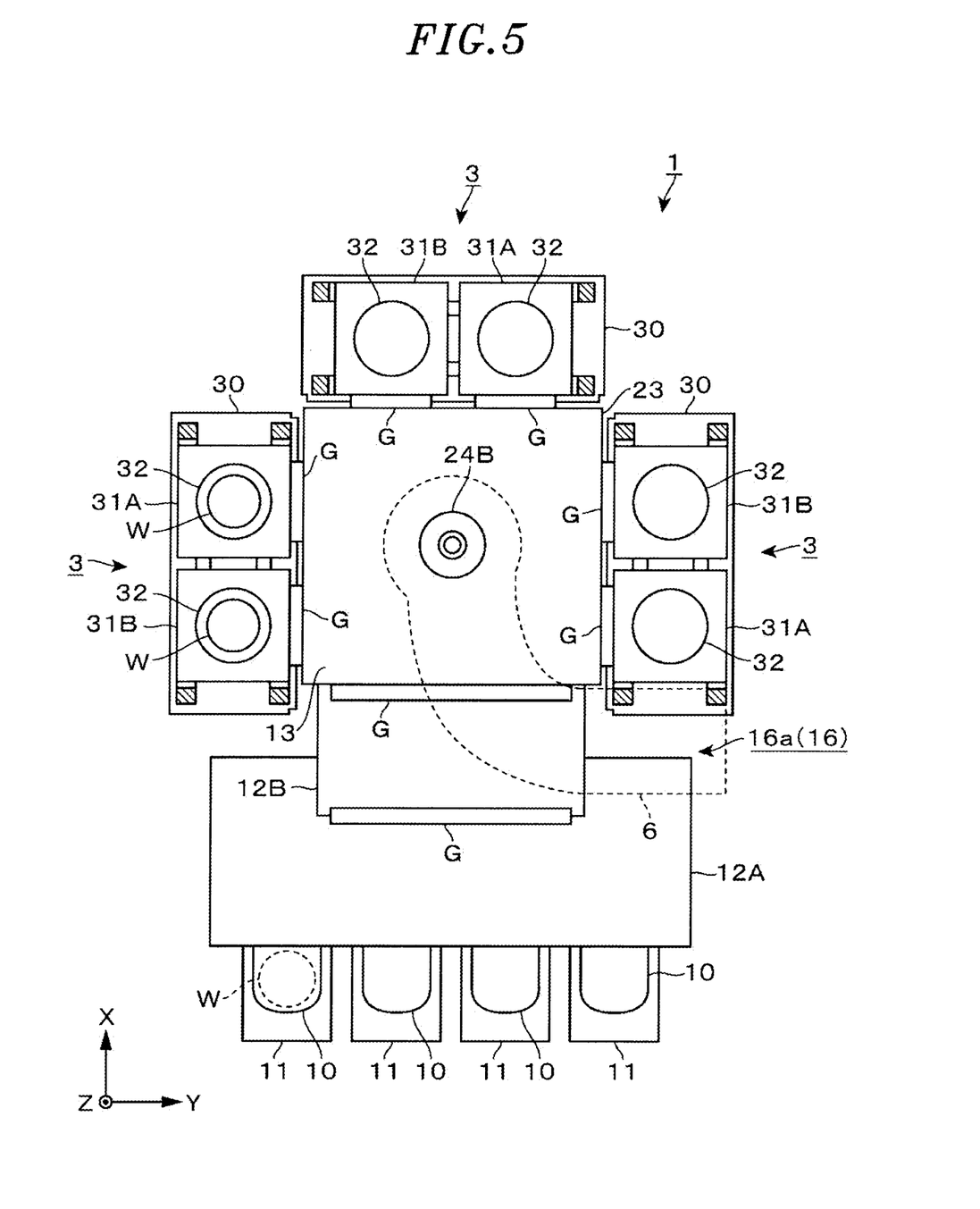
FIG. 5 is a plan view showing an arrangement example of the slide plate.

The slide plate 6 is installed on a floor surface of the space (the maintenance passage 16 and the maintenance space 230) below the load lock chamber 12B and the vacuum transfer chamber 23 which extends from the opening 16*a* of the maintenance passage 16 to a placing position of the driving part 24B. In FIG. 5, an area where the slide plate 6 is placed is indicated by a dashed line. For convenience of illustration, FIG. 5 omits the illustration of the multi jointed arm 24A and the placing portions 22 in the load lock chamber 12B as appropriate.

Figure 4:
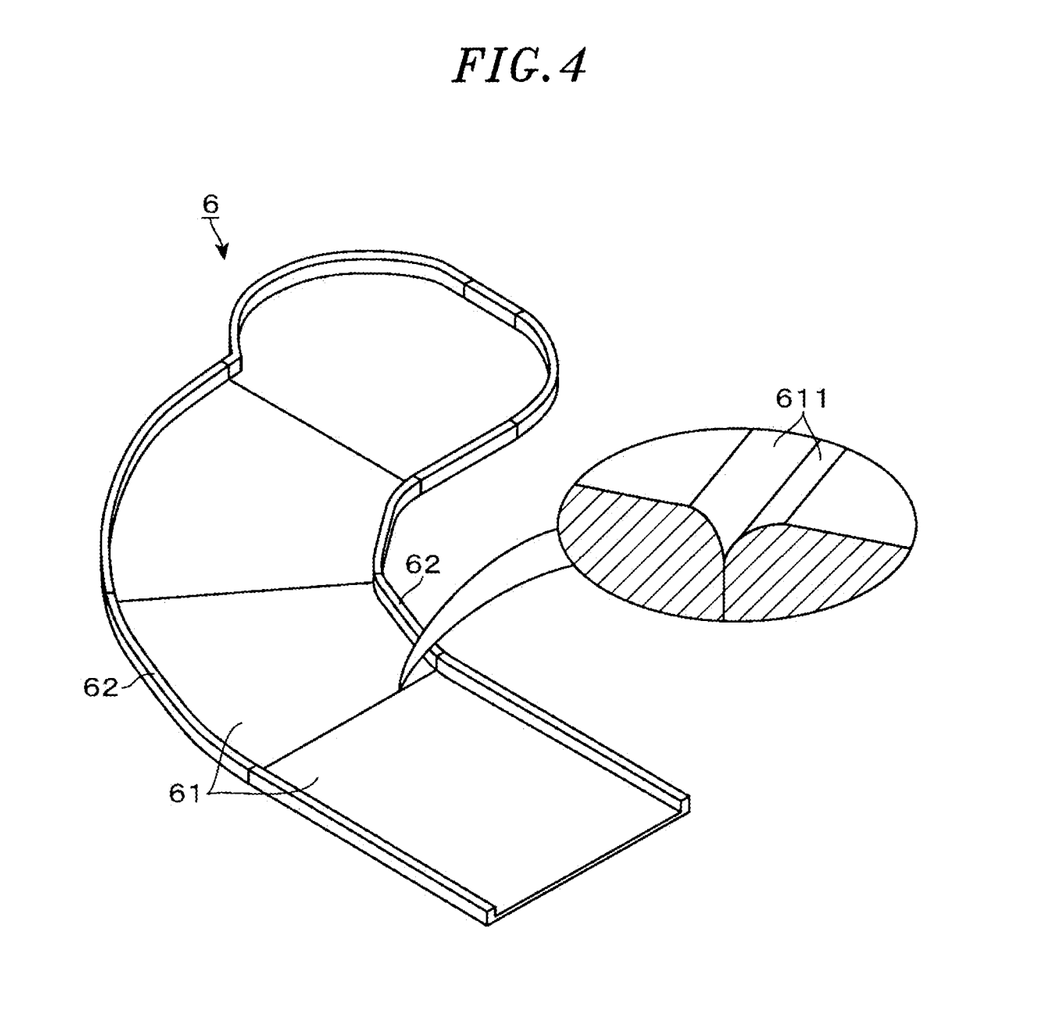
FIG. 4 is a perspective view showing a configuration example of a slide plate.

In the example shown in FIG. 5, the slide plate 6 is provided so as to extend along the transfer passage of the driving part 24B. As shown in FIG. 4, projecting wall-shaped guide portions 62 having a height of several millimeters to several centimeters are provided at both ends of the transfer passage formed by the slide plate 6.

For example, the slide plate 6 is configured by combining a plurality of plate members 61 made of stainless metal plates with polished surfaces. By combining the plurality of plate members 61, the slide plate 6 is detachably attached to the floor surfaces of the maintenance passage 16 and the maintenance space 230.

Here, as the resin material constituting the resin plate 53 on the bottom of the transfer container 5 shown in FIG. 3, a material having a coefficient of friction with the stainless plate forming the slide plate 6, for example, within a range of about 0.03 to 0.3 is selected. Examples of such resins can include polyacetal, polyester, and fluororesin.

As described above, the slide plate 6 is configured by combining the plurality of plate members 61, while the transfer container 5 accommodating the driving part 24B moves on the slide plate 6 by sliding movement. Therefore, if a step is formed at the abutting portion of the adjacent plate members 61, the transfer container 5 that is slidingly moved may be caught by the step and its movement may be hindered.

Therefore, as shown in the enlarged view of FIG. 4, a corner of the upper surface of each plate member 61 is chamfered at the abutting portion. FIG. 4 shows an example in which a chamfered portion 611 is formed by chamfering in a curved surface shape. The shape of the chamfered portion 611 is not limited to a curved surface shape, and chamfering may be performed in a shape of an inclined surface. As a processing method for forming the chamfered portion 611, a chamfering process for crushing the corner on the upper surface at the abutting portion may be performed, or the corner may be scraped with a grinder.

<Maintenance Work>

Figure 6B:
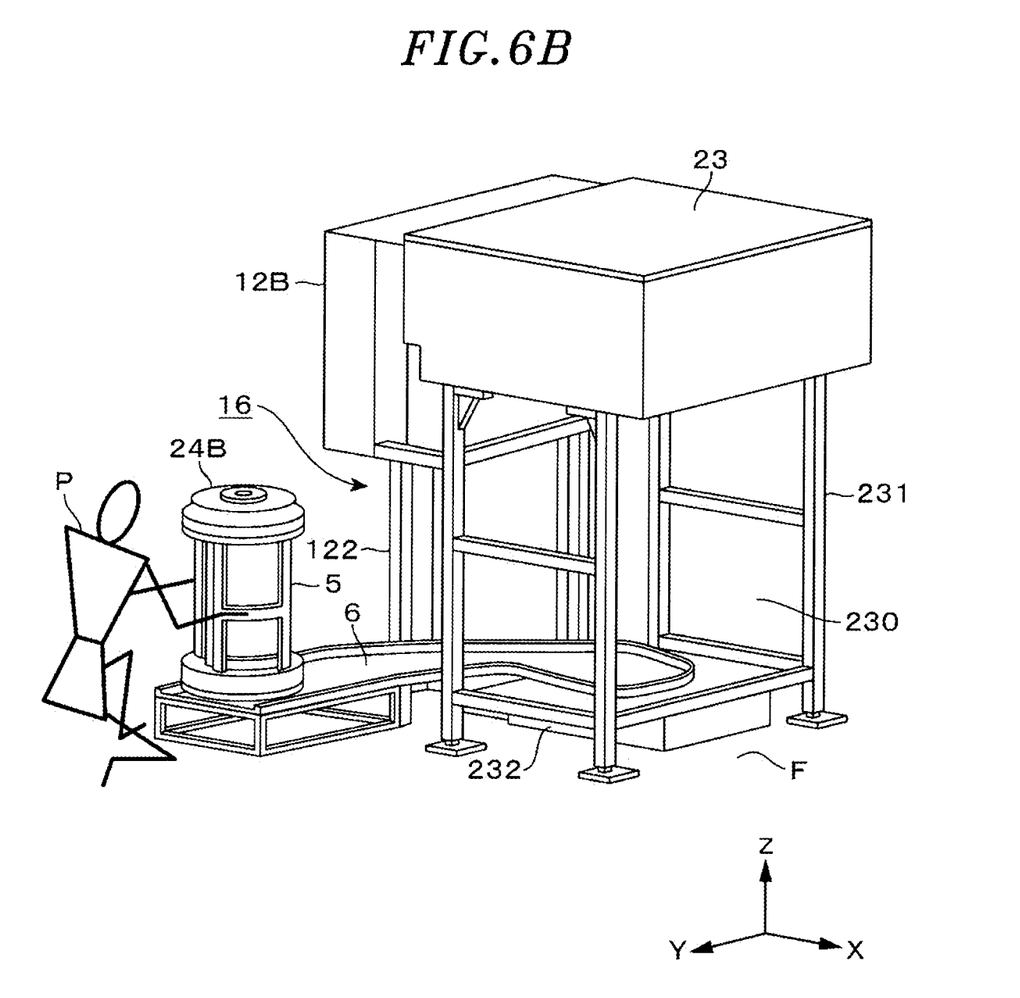
FIG. 6B is a second explanatory diagram relating to the example of the unloading operation of the driving mechanism.

In the substrate processing system 1 having the configuration described above, an example of maintenance work including an operation of removing the driving part 24B will be described with reference to FIGS. 6A and 6B. For convenience of illustration, the processing modules 3 and the atmospheric transfer chamber 12A are omitted in these figures, but in reality, the processing modules 3 and the atmospheric transfer chamber 12A are disposed around the vacuum transfer chamber 23 and the load lock chamber 12B, as shown in FIGS. 1 and 2.

At the start of the maintenance work, the processing of the wafer W in the substrate processing system 1 is finished, and the inside of the vacuum transfer chamber 23 is brought into the atmosphere. Then, a lid (not shown) on the upper surface side of the vacuum transfer chamber 23 is opened, and the multi-jointed arm 24A is removed by using a trolley crane or hoist disposed above the vacuum transfer chamber 23.

On the other hand, on the lower side of the vacuum transfer chamber 23 and the load lock chamber 12B, the worker P enters the maintenance space 230 through the maintenance passage 16 and installs the slide plate 6. Next, the transfer container 5 is loaded into the maintenance space 230, the detachable portion 52 is removed, and the lower end portion of the driving part 24B is inserted into an opening of the main body 51.

After that, the driving part 24B is removed from the vacuum transfer chamber 23, and the driving part 24B is gradually lowered to be accommodated in the transfer container 5 (main body 51). At this time, through an opening in the bottom surface of the vacuum transfer chamber 23 provided for connecting the multi jointed arm 24A and the driving part 24B, the driving part 24B may be lowered gradually after the driving part 24B is suspended by the above-described hoist provided above the vacuum transfer chamber 23. Alternatively, the driving part 24B may be gradually lowered while supporting a flange portion of the driving part 24B from the lower surface side using a jack placed on a table or the like.

After the driving part 24B is accommodated in the transfer container 5, the detachable portion 52 is attached to the main body 51 to fix the driving part 24B. After that, the worker P pushes the transfer container 5 in the direction of travel, thereby causing the transfer container 5 to slide (FIG. 6A). Then, after passing through the maintenance passage 16 and reaching a position where the opening 16*a* is formed, the transfer container 5 as a whole is placed on a trolley or the like and transferred to a shop where maintenance of the driving part 24B is performed.

The driving part 24B may also be lifted above the vacuum transfer chamber 23 using a trolley crane or a hoist and transferred. However, as described above, the driving part 24B has a height dimension in the range of about 550 to 850 mm. In order to take out the entire driving part 24*b* through a region above the processing modules 3 and the atmospheric transfer chamber 12A shown in FIG. 2, there is a need to install a large frame around the substrate processing system 1 and then install a trolley crane or a hoist. Therefore, compared to the case where only the flat multi-jointed arm 24A is transferred from the upper surface side, large-scale transfer equipment must be prepared. In this respect, on the lower side of the vacuum transfer chamber 23, the transfer container 5 and the slide plate 6 having a simple structure can transfer the driving part 24B.

When attaching the driving part 24B, the driving part 24B is transferred in the reverse order of the above-described work and attached to the lower surface of the vacuum transfer chamber 23.

In addition to the removal of the driving part 24B, various maintenance works that can be performed under the lower surface of the load lock chamber 12B and the vacuum transfer chamber 23 are also performed by the worker P entering the maintenance passage 16 or the maintenance space 230.

According to the substrate processing system 1 described above, the maintenance passage 16 for the worker P to enter the maintenance space 230 below the vacuum transfer chamber 23 is provided below the load lock chamber 12B. By employing this configuration, it is not necessary to secure a passage for the worker P to enter by providing a large gap between the processing modules 3 arranged along the side surface of the vacuum transfer chamber 23 or by omitting the installation of one processing module 3. Therefore, it is possible to perform the maintenance of the vacuum transfer chamber 23 while suppressing an increase in the exclusive area of the substrate processing system 1.

Here, the configuration of the substrate processing system 1 is not limited to the example described with reference to FIGS. 1 and 2. For example, the planar shape of the vacuum transfer chamber 23 may be a rectangular shape elongated in the front-rear direction, and a plurality of sets of processing modules 3 may be arranged on the left and right side surfaces when viewed from the front. Alternatively, the planar shape of the vacuum transfer chamber 23 may be a pentagon or more, and the processing modules 3 may be connected to the side surfaces other than the side surface to which the load lock chamber 12B is connected.

Further, it is not an essential requirement to provide in the processing modules 3 two vacuum processing chambers 31A and 31B side by side in the lateral direction, and one or three or more vacuum processing chambers may be provided.

In addition, it is not essential to provide the slide plate 6 along the transfer passage of the driving part 24B. The transfer container 5 may be slid directly on the floor surface of the maintenance space 230 or the maintenance passage 16.

Furthermore, various variations may be adopted for the configuration of the transfer container 5. For example, after placing the driving part 24B on a pedestal with casters in a vertical state or in an overturned state by a hoist or the like, the pedestal may be moved to transfer the driving part 24B.

It should be considered that the embodiments disclosed this time are illustrative in all respects and not restrictive. The embodiments described above may be omitted, substituted, or modified in various ways without departing from the scope and spirit of the appended claims.

What is claimed is:

1. A system for processing a substrate using a plurality of vacuum processing chambers, the system comprising:
    an atmospheric transfer chamber in which the substrate is transferred in an atmospheric atmosphere;
    a vacuum transfer chamber in which the substrate is transferred in a vacuum atmosphere;
    a plurality of processing modules configured by vertically arranging the vacuum processing chamber and a supplementary device provided in the vacuum processing chamber supplementarily; and
    a load lock chamber provided between the atmospheric transfer chamber and the vacuum transfer chamber, and configured to be able to switch an atmosphere therein between the atmospheric atmosphere and the vacuum atmosphere while accommodating the substrate,
    wherein the vacuum transfer chamber and the load lock chamber are arranged at a height position where a worker can enter thereunder,
    the load lock chamber and the plurality of vacuum processing chambers are connected to side surfaces of the vacuum transfer chamber, and a space below the vacuum transfer chamber is blocked from outside by the plurality of processing modules except for the side surface to which the load lock chamber is connected, and
    a space below the load lock chamber serves as a maintenance passage through which the worker enters from a direction other than the side surface to which the atmospheric transfer chamber is connected to reach the space below the vacuum transfer chamber,
    wherein the maintenance passage is provided so as to open to one side of the left and right sides of the load lock chamber when viewed from the atmospheric transfer chamber side.

2. The system of claim 1, wherein the vacuum transfer chamber comprises a substrate transfer robot having a multi-jointed arm for substrate transfer provided in the vacuum transfer chamber and a driving mechanism connected to the multi-jointed arm and provided to protrude toward the space below the vacuum transfer chamber, and
    the maintenance passage has width and height dimensions to allow passage of the driving mechanism removed from the vacuum transfer chamber.

3. The system of claim 2, wherein the driving mechanism is configured as a columnar body elongated in a vertical direction, and passes through the maintenance passage with a long axis of the columnar body oriented in the vertical direction.

4. The system of claim 2, wherein the driving mechanism is transferred while being accommodated in a transfer container for transfer, and the width and height of the maintenance passage are configured as dimensions to allow passage of the transfer container in which the driving mechanism is accommodated.

5. The system of claim 4, wherein a slide plate for slidingly moving the transfer container is provided on a floor surface of the space below the vacuum transfer chamber and the load lock chamber extending from the maintenance passage to a position where the driving mechanism is installed.

6. The system of claim 5, wherein the slide plate is provided so as to extend along a transfer passage of the driving mechanism, and projecting wall-shaped guide portions are provided at both end positions of the transfer passage.

7. The system of claim 5, wherein the slide plate is configured to be detachable by combining a plurality of plate members, and abutting portions of adjacent plate members are chamfered on an upper surface side in order to avoid catching the transfer container that slides.

8. The system of claim 1, wherein the load lock chamber and the vacuum transfer chamber are placed at a height position at which the substrate is transferred at a transfer height of 1500 mm or more from a floor surface of a building in which the system is installed.

9. The system of claim 1, wherein a surface on the other side of the load lock chamber, which extending downward, is blocked by a device constituting the system.

10. A maintenance method for a system for processing a substrate using a plurality of vacuum processing chambers in a vacuum atmosphere, the system comprising:
    an atmospheric transfer chamber in which the substrate is transferred in an atmospheric atmosphere;
    a vacuum transfer chamber in which the substrate is transferred in a vacuum atmosphere;
    a plurality of processing modules configured by vertically arranging the vacuum processing chamber and a supplementary device provided in the vacuum processing chamber supplementarily; and a load lock chamber provided between the atmospheric transfer chamber and the vacuum transfer chamber, and configured to be able to switch an atmosphere therein between the atmospheric atmosphere and the vacuum atmosphere while accommodating the substrate, wherein the vacuum transfer chamber and the load lock chamber are arranged at a height position where a worker can enter thereunder, the load lock chamber and the plurality of vacuum processing chambers are connected to side surfaces of the vacuum transfer chamber, and a space below the vacuum transfer chamber is blocked from outside by the plurality of processing modules except for the side surfaces to which the load lock chamber is connected, a space below the load lock chamber serves as a maintenance passage through which the worker enters from a direction other than the side surface to which the atmospheric transfer chamber is connected to reach the space below the vacuum transfer chamber, wherein the maintenance passage is provided so as to open to one side of the left and right sides of the load lock chamber when viewed from the atmospheric transfer chamber side, and the worker enters the maintenance passage to perform maintenance.

\* \* \* \* \*